(12) United States Patent
So

(10) Patent No.: US 11,497,120 B2
(45) Date of Patent: Nov. 8, 2022

(54) ELECTRONIC CARD, METHOD OF MANUFACTURING ELECTRONIC CARD, AND ELECTRONIC APPARATUS

(71) Applicant: FUJITSU LIMITED, Kawasaki (JP)

(72) Inventor: Tsuyoshi So, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 124 days.

(21) Appl. No.: 16/993,875

(22) Filed: Aug. 14, 2020

(65) Prior Publication Data

US 2021/0068258 A1 Mar. 4, 2021

(30) Foreign Application Priority Data

Sep. 4, 2019 (JP) .............................. JP2019-161470

(51) Int. Cl.
| | |
|---|---|
| *H05K 1/02* | (2006.01) |
| *H05K 1/18* | (2006.01) |
| *H05K 1/11* | (2006.01) |
| *H05K 3/30* | (2006.01) |
| *H05K 7/14* | (2006.01) |

(52) U.S. Cl.
CPC .......... *H05K 1/181* (2013.01); *H05K 1/0203* (2013.01); *H05K 1/115* (2013.01); *H05K 3/303* (2013.01); *H05K 7/1418* (2013.01); *H05K 2201/10598* (2013.01)

(58) Field of Classification Search
CPC ...... H05K 1/0203; H05K 1/181; H05K 1/115; H05K 3/303; H05K 7/1418; H05K 2201/10598

USPC ......................................................... 361/709
See application file for complete search history.

(56) References Cited

U.S. PATENT DOCUMENTS

| | | | | |
|---|---|---|---|---|
| 4,323,914 A | * | 4/1982 | Berndlmaier | ....... H01L 23/3121 257/E23.125 |
| 5,249,101 A | * | 9/1993 | Frey | ..................... H01L 23/3135 264/272.17 |
| 6,317,326 B1 | * | 11/2001 | Vogel | ..................... H01L 23/473 361/698 |
| 6,891,259 B2 | * | 5/2005 | Im | .......................... H01L 23/16 257/796 |

(Continued)

FOREIGN PATENT DOCUMENTS

| | | |
|---|---|---|
| JP | 2004-247669 A | 9/2004 |
| JP | 2016-178285 A | 10/2016 |
| JP | 2019-68029 A | 4/2019 |

*Primary Examiner* — Sherman Ng
(74) *Attorney, Agent, or Firm* — WHDA, LLP

(57) ABSTRACT

An electronic card includes a substrate, an electronic device bonded to the substrate via a solder bump, and configured to include a first ceiling, and a cover fixed to the substrate, provided over the electronic device, and configured to include a second ceiling that faces the first ceiling, wherein the first ceiling or the second ceiling is provided with an annular member extending in a facing direction of the first ceiling and the second ceiling, the annular member forming an annular shape along a circumferential direction of the first ceiling, wherein the first ceiling and the second ceiling form a gap between the first ceiling and the second ceiling filled with a filling material inside the annular member, and wherein the second ceiling includes a through hole at a position that overlaps the filling material when viewed in a plan view of the second ceiling.

16 Claims, 13 Drawing Sheets

(56) References Cited

U.S. PATENT DOCUMENTS

| | | | | |
|---|---|---|---|---|
| 8,021,925 B2 * | 9/2011 | Edwards | ................ | H01L 23/04 |
| | | | | 257/710 |
| 2005/0029655 A1 * | 2/2005 | Wu | .................... | H01L 23/3672 |
| | | | | 257/734 |
| 2009/0085198 A1 * | 4/2009 | Vadakkanmaruveedu | .................. | |
| | | | | H01L 23/427 |
| | | | | 257/714 |
| 2012/0098119 A1 * | 4/2012 | Refai-Ahmed | ....... | H01L 25/115 |
| | | | | 438/109 |
| 2013/0105975 A1 * | 5/2013 | Hussain | ................. | H01L 23/24 |
| | | | | 257/734 |

* cited by examiner

ELECTRONIC CARD, METHOD OF MANUFACTURING ELECTRONIC CARD, AND ELECTRONIC APPARATUS

CROSS-REFERENCE TO RELATED APPLICATION

This application is based upon and claims the benefit of the prior Japanese Patent Application No. 2019-161470, filed on Sep. 4, 2019, the entire contents of which are incorporated herein by reference.

FIELD

The embodiments discussed herein are related to an electronic card, a method of manufacturing the electronic card, and an electronic apparatus.

BACKGROUND

In the related art, there is an electronic card including a substrate, an electronic device bonded to the substrate via solder bumps, and a cover fixed to the substrate and accommodating the electronic device (see, e.g., Japanese Laid-Open Patent Publication No. 2019-068029). In this electronic card, the electronic device has a first ceiling portion on the side opposite to the substrate, and the cover has a second ceiling portion facing the first ceiling portion. A heat transfer sheet is provided between the first ceiling portion and the second ceiling portion.

Related techniques are disclosed in, for example, Japanese Laid-Open Patent Publication Nos. 2019-068029, 2004-247669, and 2016-178285.

SUMMARY

According to an aspect of the embodiments, an electronic card includes a substrate, an electronic device bonded to the substrate via a solder bump, and configured to include a first ceiling, and a cover fixed to the substrate, provided over the electronic device, and configured to include a second ceiling that faces the first ceiling, wherein the first ceiling or the second ceiling is provided with an annular member extending in a facing direction of the first ceiling and the second ceiling, the annular member forming an annular shape along a circumferential direction of the first ceiling, wherein the first ceiling and the second ceiling form a gap between the first ceiling and the second ceiling filled with a filling material inside the annular member, and wherein the second ceiling includes a through hole at a position that overlaps the filling material when viewed in a plan view of the second ceiling.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the above electronic card, for example, when the thickness of the heat transfer sheet is thicker than a prescribed thickness, or when a gap between the first ceiling portion of the electronic device and the second ceiling portion of the cover is narrower than a prescribed gap, a load may be applied to the solder bumps as the electronic device is pressed toward the substrate by the heat transfer sheet.

First, descriptions will be made on the configuration of an electronic apparatus according to an embodiment of the technique for reducing a load applied to the solder bumps disclosed in the present disclosure.

Figure 1:
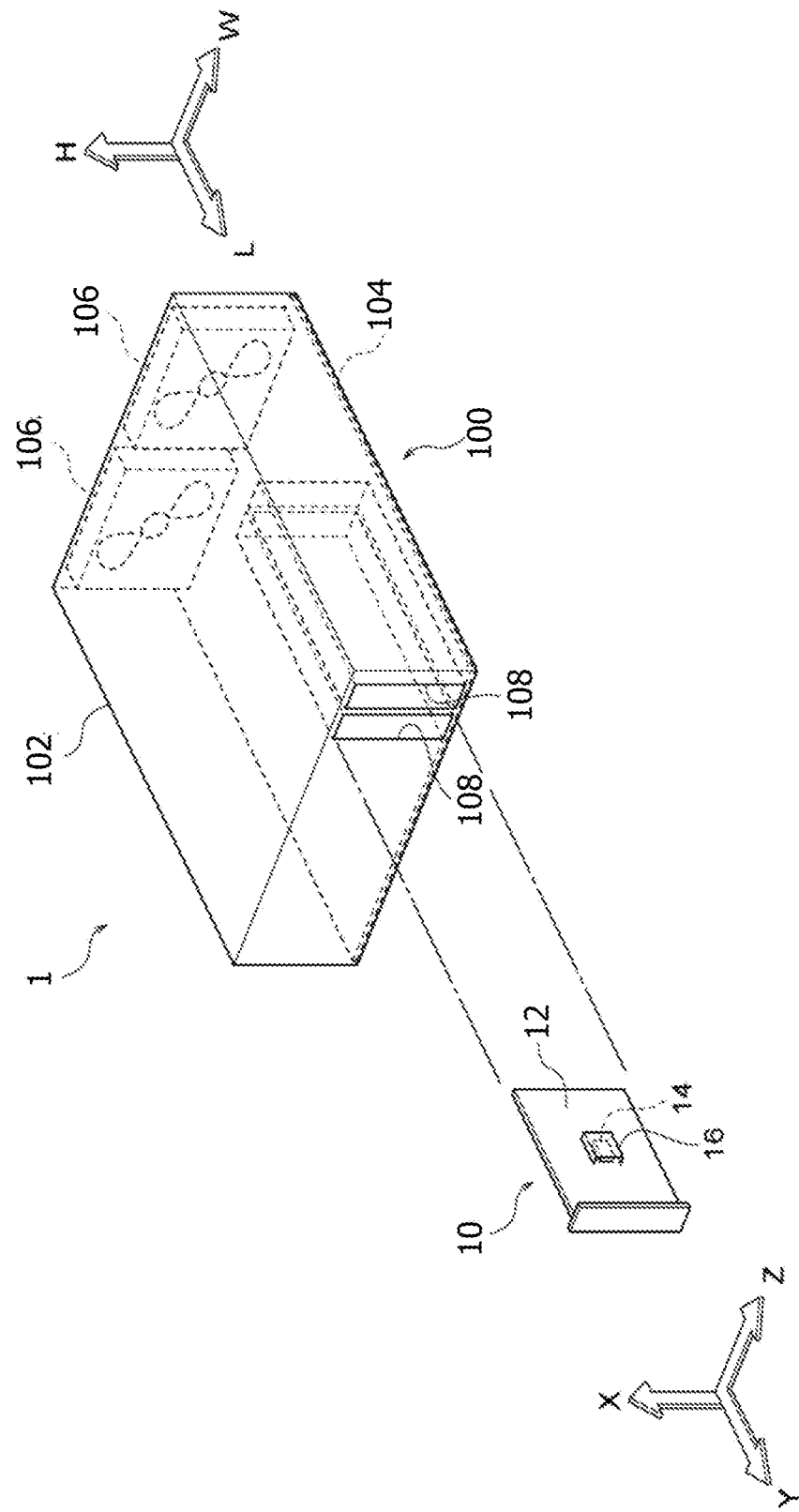
FIG. 1 is a perspective view of an electronic apparatus according to an embodiment of the technique disclosed in the present disclosure.

FIG. 1 is a perspective view of the electronic apparatus 1 according to the embodiment of the technique disclosed in the present disclosure. As illustrated in FIG. 1, the electronic apparatus 1 according to the present embodiment includes an electronic card 10 and an electronic apparatus body 100. The direction of an arrow W corresponds to a width direction of the electronic apparatus 1, the direction of an arrow L corresponds to a length direction of the electronic apparatus 1, and the direction of an arrow H corresponds to a height direction of the electronic apparatus 1.

The electronic apparatus body 100 includes a case 102, a motherboard 104, and a plurality of fans 106. The case 102 is formed in a rectangular parallelepiped shape, and the motherboard 104 and the fans 106 are accommodated inside the case 102. The motherboard 104 is disposed along the bottom of the case 102, and the fans 106 are disposed at one end of the case 102 in the arrow L direction. The fans 106 are arranged side by side in the arrow W direction.

The case 102 is provided with a plurality of slots 108 arranged side by side in the arrow W direction. Each of the slots 108 is vertically long in the arrow H direction, extends in the arrow L direction, and opens toward the opposite side of the fans 106.

The electronic card 10 is, for example, a peripheral component interconnect (PCI) card. The electronic card 10 has a substrate 12, an electronic device 14, a cover 16, and the like, as will be described later.

The electronic card 10 is inserted into the slot 108 in a state where the electronic card 10 is vertically placed. The arrow X direction corresponds to the width direction of the electronic card 10, the arrow Y direction corresponds to the length direction of the electronic card 10, and the arrow Z direction corresponds to the thickness direction of the electronic card 10. In FIG. 1, the arrow X direction is the same direction as the arrow H direction, the arrow Y direction is the same direction as the arrow L direction, and the arrow Z direction is the same direction as the arrow W direction.

The electronic card 10 is electrically connected to the motherboard 104 via a connector or the like in a state where the electronic card 10 is inserted into the slot 108. When the fans 106 are being operated while the electronic card 10 is inserted into the slot 108, a flow of air is generated inside the case 102 along the arrow L direction to supply the air to the electronic card 10.

Next, first to sixth examples of the electronic card 10 will be described in an order. In each of the figures described in the following first to sixth examples, the electronic card 10 is illustrated horizontally.

First Embodiment

Figure 2:
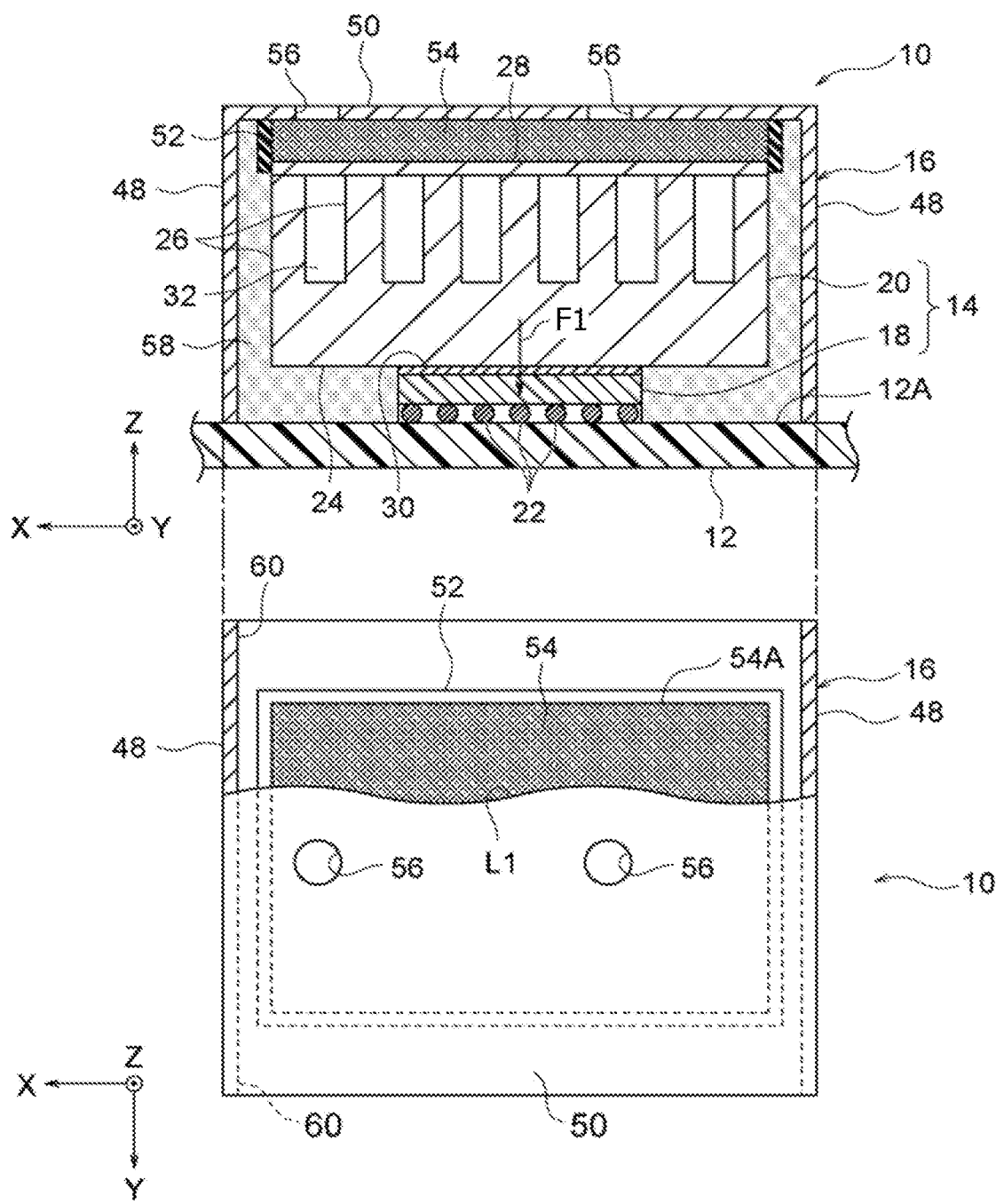
FIG. 2 is a two-sided view of an electronic card according to a first embodiment.

FIG. 2 is a two-sided view (longitudinal sectional view and plan view) illustrating a first embodiment of the electronic card 10. In the plan view illustrated in the lower side of FIG. 2, a portion of the cover 16 is cut out by a notch line L1. As illustrated in FIG. 2, the electronic card 10 includes a substrate 12, an electronic device 14, and a cover 16.

The substrate 12 is disposed taking the arrow Z direction as a plate thickness direction, and extends in the arrow X direction and the arrow Y direction. The electronic device 14 and the cover 16 are installed on the surface 12A of the substrate 12 on one side in the plate thickness direction. In the plan view illustrated in the lower side of FIG. 2, the illustration of the substrate 12 is omitted.

The electronic device 14 has an electronic component 18 and a heat sink 20. The electronic component 18 is, for example, a semiconductor chip. The electronic component 18 is bonded to the substrate 12 via a plurality of solder bumps 22.

The heat sink 20 is made of metal having a high heat dissipation property such as, for example, aluminum. The heat sink 20 has a base portion 24, a plurality of fins 26, and a first ceiling portion 28. The base portion 24 is bonded to the electronic component 18 from the opposite side of the substrate 12. A sheet-shaped heat transfer member 30 is installed between the base portion 24 and the electronic component 18, and more specifically, the heat sink 20 is bonded to the electronic component 18 via the heat transfer member 30.

The fins 26 extend from the base portion 24 toward the opposite side of the substrate 12. The fins 26 are arranged side by side in the arrow X direction. An air passage 32 extending in the arrow Y direction is formed between the fins 26.

The first ceiling portion 28 is located on the opposite side of the substrate 12, and is connected to the leading end of the fins 26. The first ceiling portion 28 is formed in a rectangular plate shape in a plan view. The first ceiling portion 28 is disposed with the arrow Z direction as the plate thickness direction, and extends in the arrow X direction and the arrow Y direction.

Figure 3:
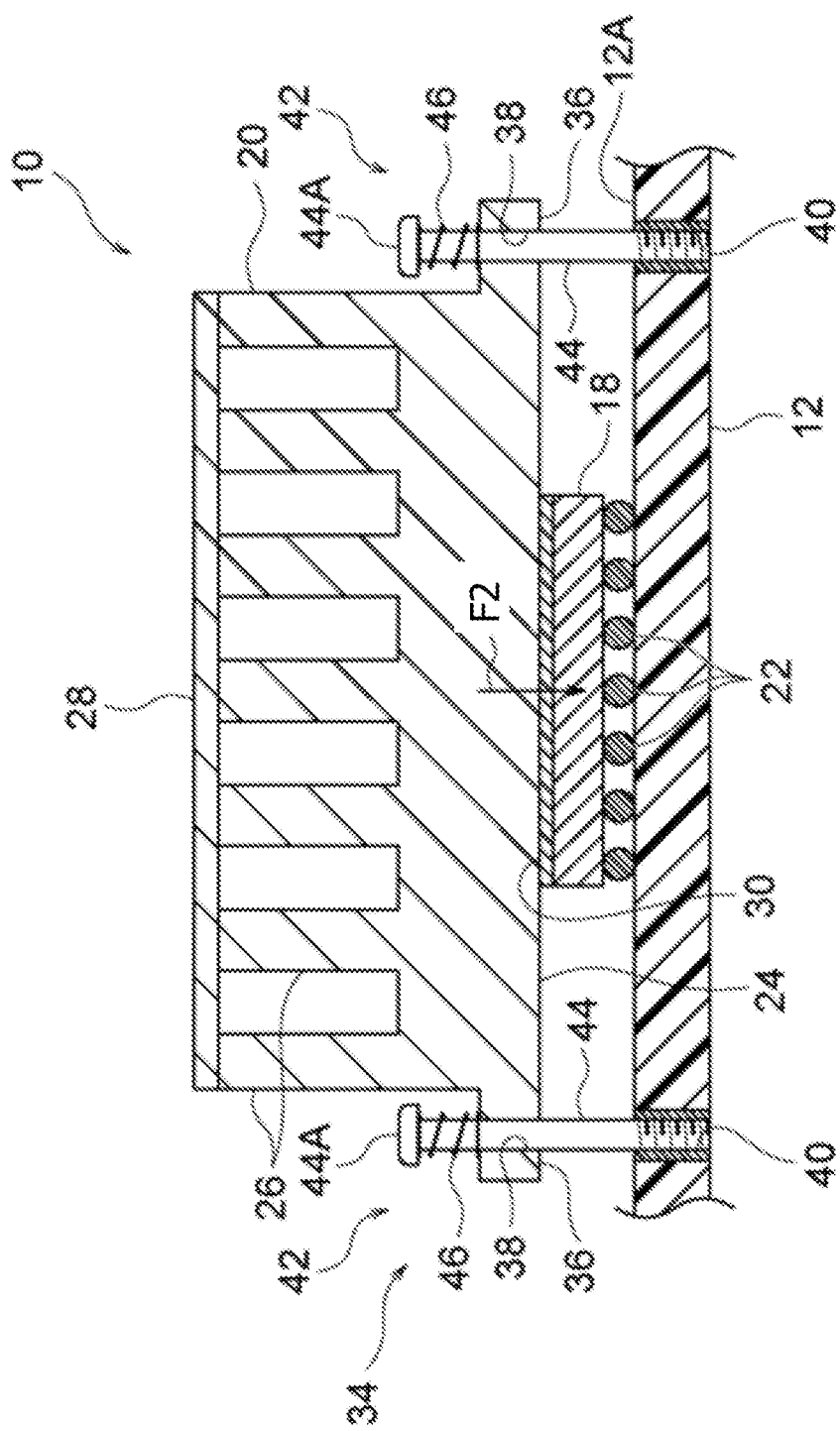
FIG. 3 is a longitudinal sectional view illustrating an example of a pressing mechanism for pressing a heat sink toward an electronic component side.

FIG. 3 is a longitudinal sectional view illustrating an example of a pressing mechanism 34 that presses the heat sink 20 of FIG. 2 toward the electronic component 18 side.

In FIG. 3, the heat sink 20 is illustrated in a section cut at a position different from that in FIG. 2. In FIG. 3, the illustration of the cover 16, an annular member 52, a filling material 54, and a closing member 58 of FIG. 2 is omitted.

As illustrated in FIG. 3, the electronic card 10 includes the pressing mechanism 34. The base portion 24 of the heat sink 20 is formed with a pair of extension portions 36 extending on both sides in the arrow X direction. Each of the extension portions 36 is formed with a hole 38 penetrating in the arrow Z direction. Further, the substrate 12 is provided with a screw hole 40 coaxially with the hole 38.

The pressing mechanism 34 has a plurality of pressing portions 42. Each of the pressing portions 42 has a bolt 44 and a spring 46. The bolt 44 is inserted into the hole 38 from the opposite side of the substrate 12, and the tip of the bolt 44 is screwed into the screw hole 40. The spring 46 is a coil spring and is attached to the bolt 44. The spring 46 is installed in a compressed state between the head portion 44A of the bolt 44 and the extension portion 36. The spring 46 presses the heat sink 20 toward the electronic component 18 side.

In the pressing mechanism 34, the amount of screwing of the bolt 44 into the screw hole 40 is adjusted, so that the amount of compression of the spring 46 is adjusted and thus, the elastic force of the spring 46 is adjusted. Thus, a pressing force F2 against the heat sink 20 to the electronic component 18 side is adjusted. In this example, the pressing force F2 against the head sink 20 is adjusted so as not to apply a load to the solder bumps 22 while pressing the heat sink 20 against the electronic component 18 with an appropriate pressure via the heat transfer member 30.

Referring back to FIG. 2, the cover 16 is made of metal having a high heat dissipation property such as, for example, aluminum. The cover 16 has a pair of side wall portions 48 and a second ceiling portion 50. The pair of side wall portions 48 is arranged to face with each other in the arrow X direction. The lower end of the pair of side wall portions 48 is fixed to the substrate 12, and the second ceiling portion 50 is connected to the upper end of the pair of side wall portions 48. The second ceiling portion 50 is formed in a rectangular plate shape in a plan view. The second ceiling portion 50 is disposed taking the arrow Z direction as the plate thickness direction, and extends in the arrow X direction and the arrow Y direction.

The electronic device 14 is accommodated inside the cover 16, and the second ceiling portion 50 faces the first ceiling portion 28 in the arrow Z direction. The first ceiling portion 28 is provided with the annular member 52 extending in a direction in which the first ceiling portion 28 and the second ceiling portion 50 face with each other and having an annular shape along the circumferential direction of the first ceiling portion 28.

The annular member 52 projects toward the second ceiling portion 50 side with respect to the first ceiling portion 28. The annular member 52 is made of, for example, a tape material that is annularly wound around the first ceiling portion 28 along the circumferential direction of the first ceiling portion 28. The end of the annular member 52 on the second ceiling portion 50 side is in contact with the second ceiling portion 50.

The annular member 52 has flexibility by being a tape material. Because of the flexibility of the annular member 52, the annular member 52 bends even when a gap between the first ceiling portion 28 and the second ceiling portion 50 is narrower than a prescribed gap due to variations in dimension, and the like. Therefore, the annular member 52 may suppress the heat sink 20 from being pressed toward the electronic component 18 side.

The filling material 54 is filled in the gap between the first ceiling portion 28 and the second ceiling portion 50 inside the annular member 52. The filling material 54 may be either liquid or semi-liquid in a state of being filled in the gap between the first ceiling portion 28 and the second ceiling portion 50. Further, the filling material 54 may be a high viscosity liquid such as a compound. The filling material 54 is liquid or semi-liquid when it is filled in the gap between the first ceiling portion 28 and the second ceiling portion 50.

The filling material 54 may be solid by being cured after being filled in the gap between the first ceiling portion 28 and the second ceiling portion 50. In the case of solid filling material 54, the filling material 54 may be of a thermosetting type or of a room temperature curing type. Furthermore, the filling material 54 may be one-component or two-component. The filling material 54 is in contact with the first ceiling portion 28 and the second ceiling portion 50 in a state of being filled in the gap between the first ceiling portion 28 and the second ceiling portion 50.

In this way, when the filling material 54 is filled in the gap between the first ceiling portion 28 and the second ceiling portion 50, the air may be suppressed from being introduced into the gap between the first ceiling portion 28 and the second ceiling portion 50 by the filling material 54. As a result, since the flow rate of the air flowing through the air passage 32 between the fins 26 may be increased, the cooling efficiency of the heat sink 20 may be improved.

Further, the filling material 54 may be a thermal bonding material having a heat transfer property. When the filling material 54 has the heat transfer property, the heat of the heat sink 20 is transferred to the cover 16, so that the cooling performance of the electronic component 18 may be improved.

A pressing force F1 illustrated in FIG. 2 is a pressing force with which the filling material 54 presses the heat sink 20 toward the electronic component 18 side. As will be described later, the pressing force F1 with which the filling material 54 presses the heat sink 20 toward the electronic component 18 side is set to a weaker force than the pressing force F2 with which the pressing mechanism 34 (see, e.g., FIG. 3) presses the heat sink 20 toward the electronic component 18 side.

As illustrated in the lower figure of FIG. 2, the filling material 54 is filled inside the annular member 52 to contact the inner peripheral surface of the annular member 52 over the circumferential direction of the annular member 52. A plurality of through-holes 56 is formed in the second ceiling portion 50 that covers the filling material 54. The through-holes 56 are formed at positions overlapping the filling material 54 in a plan view of the second ceiling portion 50. That is, the through-holes 56 are located inside the outer peripheral edge 54A of the filling material 54 in the plan view of the second ceiling portion 50.

As an example, two through-holes 56 are formed in the second ceiling portion 50, but the number of the through-holes 56 may be three or more. The through-holes 56 function as an injection hole for injecting the filling material 54 and an air vent hole when injecting the filling material 54. That is, one of the through-holes 56 functions as an injection hole for injecting the filling material 54, and the other through-hole 56 of the through holes 56 functions as an air vent hole when injecting the filling material 54.

The closing member 58 is filled in each of a gap between the pair of side wall portions 48 and the heat sink 20 and a gap between the substrate 12 and the heat sink 20. The closing member 58 is made of, for example, a foam material or a sheet material.

In this way, when the closing member 58 is used, the air may be suppressed from being introduced into the gap between the pair of side wall portions 48 and the heat sink 20 and the gap between the substrate 12 and the heat sink 20 by the closing member 58. As a result, the flow rate of the air flowing through the air passage 32 between the fins 26 may be increased, so that the cooling efficiency of the heat sink 20 may be improved.

Further, the closing member 58 may have a heat transfer property. When the closing member 58 has a heat transfer property, the heat of the heat sink 20 is transferred to the cover 16, so that the cooling performance of the electronic component 18 may be improved.

The cover 16 is formed in a duct shape having a pair of openings 60 facing each other in the arrow Y direction. When the above-described fans 106 (see, e.g., FIG. 1) operate, the air is supplied to the inside of the cover 16 through the openings 60 located on the side of the fans 106. The air supplied to the inside of the cover 16 flows through the air passage 32 formed between the fins 26 and is discharged to the outside of the cover 16 through the openings 60 located on the opposite side of the fans 106. The heat sink 20 is cooled by the flow of air in the air passage 32, thereby the electronic component 18 is cooled.

Subsequently, a method of manufacturing the electronic card 10 according to the first embodiment will be described.

Figure 4:
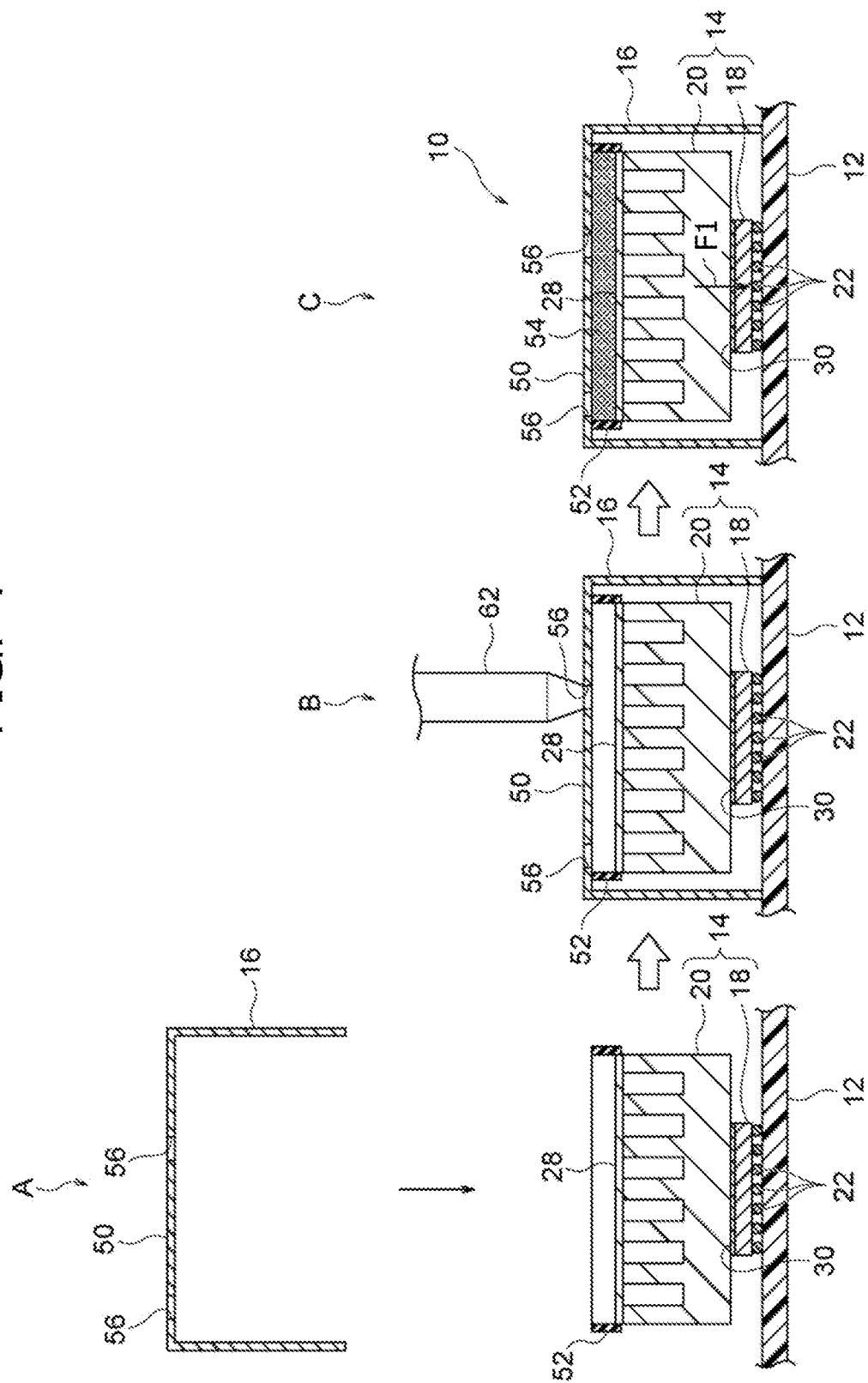
FIG. 4 is a view for explaining a method of manufacturing the electronic card according to the first embodiment.

FIG. 4 is a view for explaining a method of manufacturing the electronic card 10 according to the first embodiment. First, as illustrated in step A of FIG. 4, the electronic component 18 is bonded to the substrate 12 via the solder bumps 22 and the heat sink 20 is bonded to the electronic component 18 via the heat transfer member 30. Either of the bonding of the electronic component 18 to the substrate 12 and the bonding of the heat sink 20 to the electronic component 18 may be performed first.

The heat sink 20 is fixed to the substrate 12 by the pressing mechanism 34 (see, e.g., FIG. 3). Further, a tape material is annularly wound around the first ceiling portion 28 along the circumferential direction of the first ceiling portion 28, and the tape member forms the annular member 52.

Then, as illustrated in step B of FIG. 4, the cover 16 is fixed to the substrate 12, and the electronic component 18 and the heat sink 20 are accommodated inside the cover 16. At this time, the end of the annular member 52 provided in the first ceiling portion 28 on the second ceiling portion 50 side is in contact with the second ceiling portion 50.

The closing member 58 (see, e.g., FIG. 2) is omitted in FIG. 4. The closing member 58 is assembled to the electronic component 18 and the heat sink 20 before the cover 16 is fixed to the substrate 12, or is filled inside the cover 16 after the cover 16 is fixed to the substrate 12.

Next, a nozzle 62 is connected to one through-hole 56 formed in the second ceiling portion 50. Then, as illustrated in step B to step C of FIG. 4, the filling material 54 is filled in the gap between the first ceiling portion 28 and the second ceiling portion 50 inside the annular member 52 from the nozzle 62 through the one through-hole 56.

When the filling material 54 is filled in the gap between the first ceiling portion 28 and the second ceiling portion 50, a part of the filling material 54 may overflow from the other through-hole 56 together with the air. The filling of the filling material 54 is stopped immediately before a part of the filling material 54 overflows from the other through-holes 56. As a result, the increase in pressure of the filling material 54 filled in the gap between the first ceiling portion 28 and the second ceiling portion 50 is suppressed.

In this way, by suppressing the pressure increase of the filling material 54, the pressing force F1 by which the filling material 54 presses the heat sink 20 toward the electronic component 18 side may be suppressed to a force weaker than the pressing force F2 by which the pressing mechanism 34 (see, e.g., FIG. 3) presses the heat sink 20 toward the electronic component 18 side.

Subsequently, the operation and effects of the electronic card 10 according to the first embodiment will be described.

First, in order to clarify the operation and effects of the electronic card 10 according to the first embodiment, an electronic card 110 according to a comparative example will be described with reference to FIGS. 12 and 13.

Figure 12:
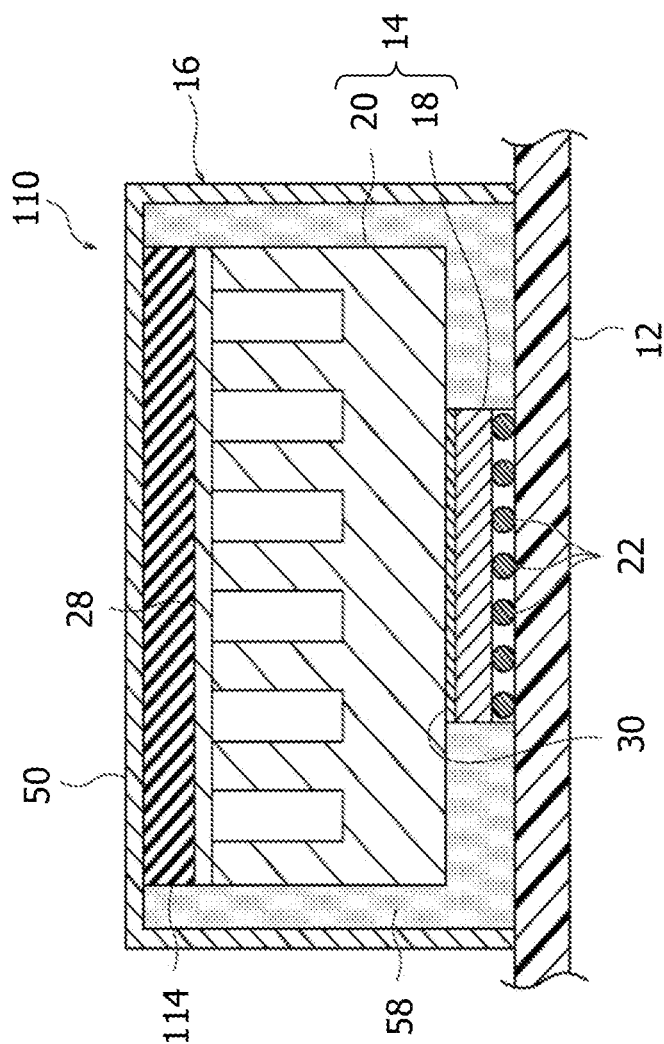
FIG. 12 is a longitudinal sectional view of an electronic card according to a comparative example.
Figure 12:
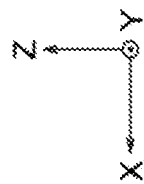

FIG. 12 is a longitudinal sectional view of an electronic card 110 according to a comparative example. In the electronic card 110 according to the comparative example illustrated in FIG. 12, a heat transfer sheet 114 is used instead of the annular member 52 and the filling material 54 in the electronic card 10 according to the first embodiment (see, e.g., FIG. 2). The heat transfer sheet 114 is made of, for example, an elastic material such as foamed vinyl, and is provided between the first ceiling portion 28 and the second ceiling portion 50 in a compressed state.

Figure 13:
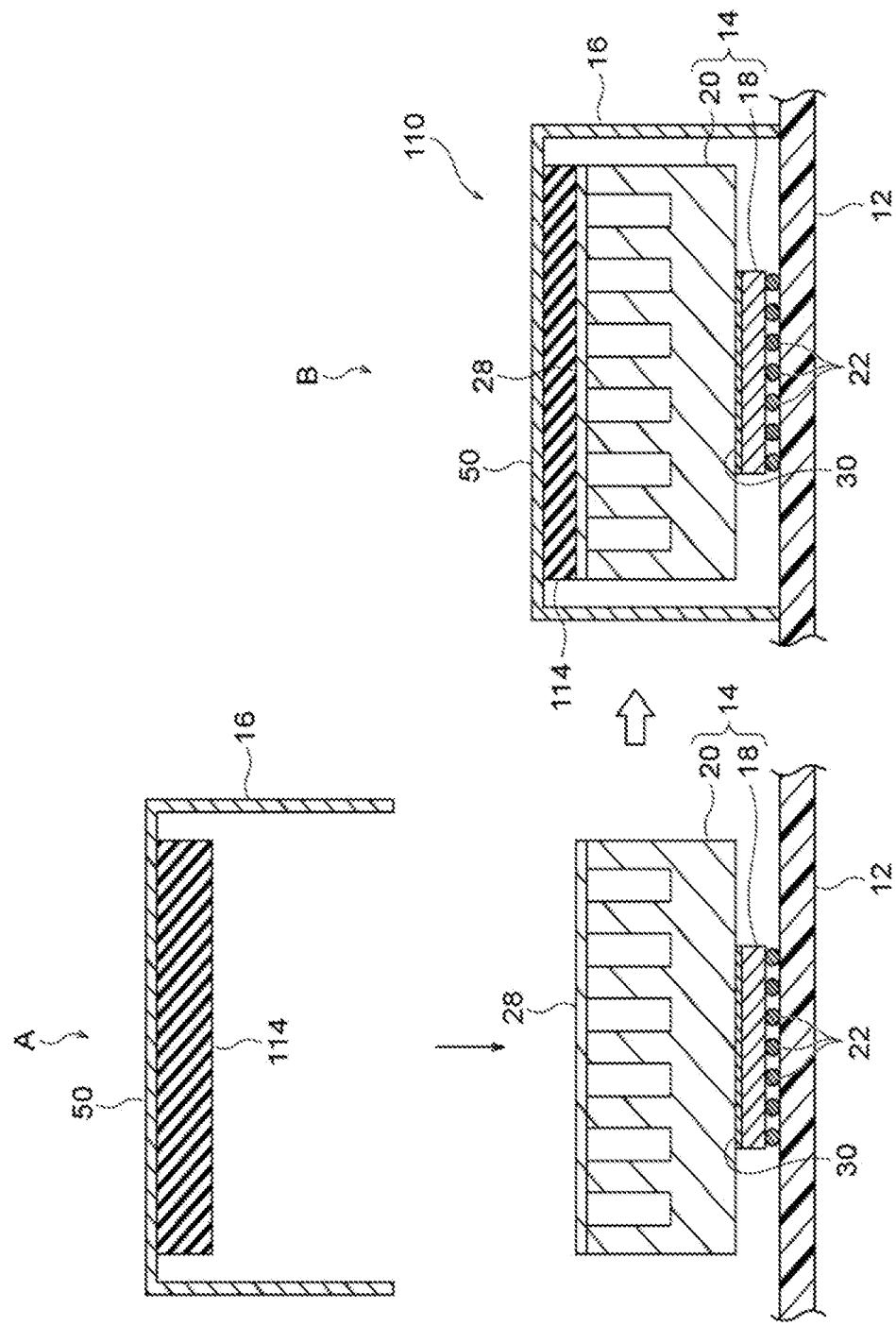
FIG. 13 is a view for explaining a method of manufacturing the electronic card according to the comparative example.

FIG. 13 is a view for explaining a method of manufacturing the electronic card 110 according to the comparative example. As illustrated in FIG. 13, in the method of manufacturing the electronic card 110 according to the comparative example, first, as illustrated in step A of FIG. 13, the electronic component 18 is bonded to the substrate 12 via the solder bumps 22, and the heat sink 20 is bonded to the electronic component 18 via the heat transfer member 30.

In addition, the heat transfer sheet 114 is pasted to the lower surface of the second ceiling portion 50. The heat transfer sheet 114 is formed to be thicker than the gap between the first ceiling portion 28 and the second ceiling portion 50 when the cover 16 is fixed to the substrate 12.

Then, as illustrated in step B of FIG. 13, the cover 16 is fixed to the substrate 12, and the electronic component 18 and the heat sink 20 are accommodated inside the cover 16. When the cover 16 is fixed to the substrate 12, the first ceiling portion 28 and the second ceiling portion 50 are interconnected via the heat transfer sheet 114 while the heat transfer sheet 114 is elastically compressed.

However, the method of manufacturing the electronic card 110 according to this comparative example has the following problems. That is, when the thickness of the heat transfer sheet 114 is thicker than a prescribed thickness, or when the gap between the first ceiling portion 28 and the second ceiling portion 50 is narrower than a prescribed gap, the heat sink 20 is pressed toward the substrate 12 by the heat transfer sheet 114. As a result, a load may be applied to the solder bumps 22. Therefore, there is room for improvement in order to suppress damage to the solder bumps 22.

In contrast, in the method of manufacturing the electronic card 10 according to the first embodiment illustrated in FIGS. 2 to 4, the annular member 52 that extends in the facing direction of the first ceiling portion 28 and the second ceiling portion 50 and has an annular shape along the circumferential direction of the first ceiling portion 28 is installed in the first ceiling portion 28. Then, the filling material 54 is filled in the gap between the first ceiling portion 28 and the second ceiling portion 50 inside the annular member 52 through one through-hole 56 formed in the second ceiling portion 50.

Therefore, for example, even when the gap between the first ceiling portion 28 and the second ceiling portion 50 is narrower than the prescribed gap, a variation in the size of this gap may be absorbed, so that the heat sink 20 may be suppressed from being pressed toward the substrate 12 side by the filling material 54. As a result, it is possible to prevent a load from being applied to the solder bumps 22, so that the damage to the solder bumps 22 may be suppressed.

In addition, in the method of manufacturing the electronic card 10 according to the first embodiment, the gap between the first ceiling portion 28 and the second ceiling portion 50 is filled with the filling material 54, and the filling of the filling material 54 is stopped immediately before a part of the filling material 54 overflows from the other through-hole 56 together with the air. Therefore, it is possible to suppress the pressure increase of the filling material 54 filled in the gap between the first ceiling portion 28 and the second ceiling portion 50. As a result, the pressing force F1 by which the filling material 54 presses the heat sink 20 toward the electronic component 18 side is suppressed to a force weaker than the pressing force F2 by which the pressing mechanism 34 (see, e.g., FIG. 3) presses the heat sink 20 toward the electronic component 18 side.

In addition, in the electronic card 10 according to the first embodiment, the annular member 52 that has an annular shape along the circumferential direction of the first ceiling portion 28 is installed in the first ceiling portion 28, and the filling material 54 is filled inside the annular member 52. Therefore, it is possible to prevent the filling material 54 from flowing out of the gap between the first ceiling portion 28 and the second ceiling portion 50, so that the gap between the first ceiling portion 28 and the second ceiling portion 50 may be closed by the filling material 54. Thus, the filling material 54 may prevent the air from flowing into the gap between the first ceiling portion 28 and the second ceiling portion 50, so that the flow rate of the air flowing through the air passage 32 between the fins 26 may be increased. As a result, the cooling efficiency of the heat sink 20 may be improved.

Further, by filling the inside of the annular member 52 with the filling material 54, the shape of the annular member 52 protruding toward the second ceiling portion 50 side with respect to the first ceiling portion 28 may be maintained, so that deformation of the annular member 52 may be prevented. Thus, for example, as compared with a case where the gap between the first ceiling portion 28 and the second ceiling portion 50 is closed only by the annular member 52 without using the filling material 54, the gap between the first ceiling portion 28 and the second ceiling portion 50 may be closed in a more airtight manner.

Further, the through-holes 56 are formed in the second ceiling portion 50. Therefore, the through-hole 56 for injecting the filling material 54 and the through-hole 56 for discharging the air in the gap between the first ceiling portion 28 and the second ceiling portion 50 may be separately provided. As a result, it is possible to prevent the air from being discharged from the through-hole 56 into which the filling material 54 is injected, and the filling material 54 from scattering due to the interference between the air and the filling material 54.

Further, the annular member 52 is a tape material that is annularly wound around the first ceiling portion 28 along the circumferential direction of the first ceiling portion 28. Therefore, even when there is a variation in the circumferential length of the first ceiling portion 28, the variation may be absorbed, so that the annular member 52 may be attached to the first ceiling portion 28.

In the meantime, in the first embodiment, the annular member 52 may be other than the tape material. The annular member 52 is provided in the outer peripheral portion of the first ceiling portion 28, but may well be formed to be smaller than the first ceiling portion 28 and provided in the upper surface of the first ceiling portion 28.

Second Embodiment

Figure 5:
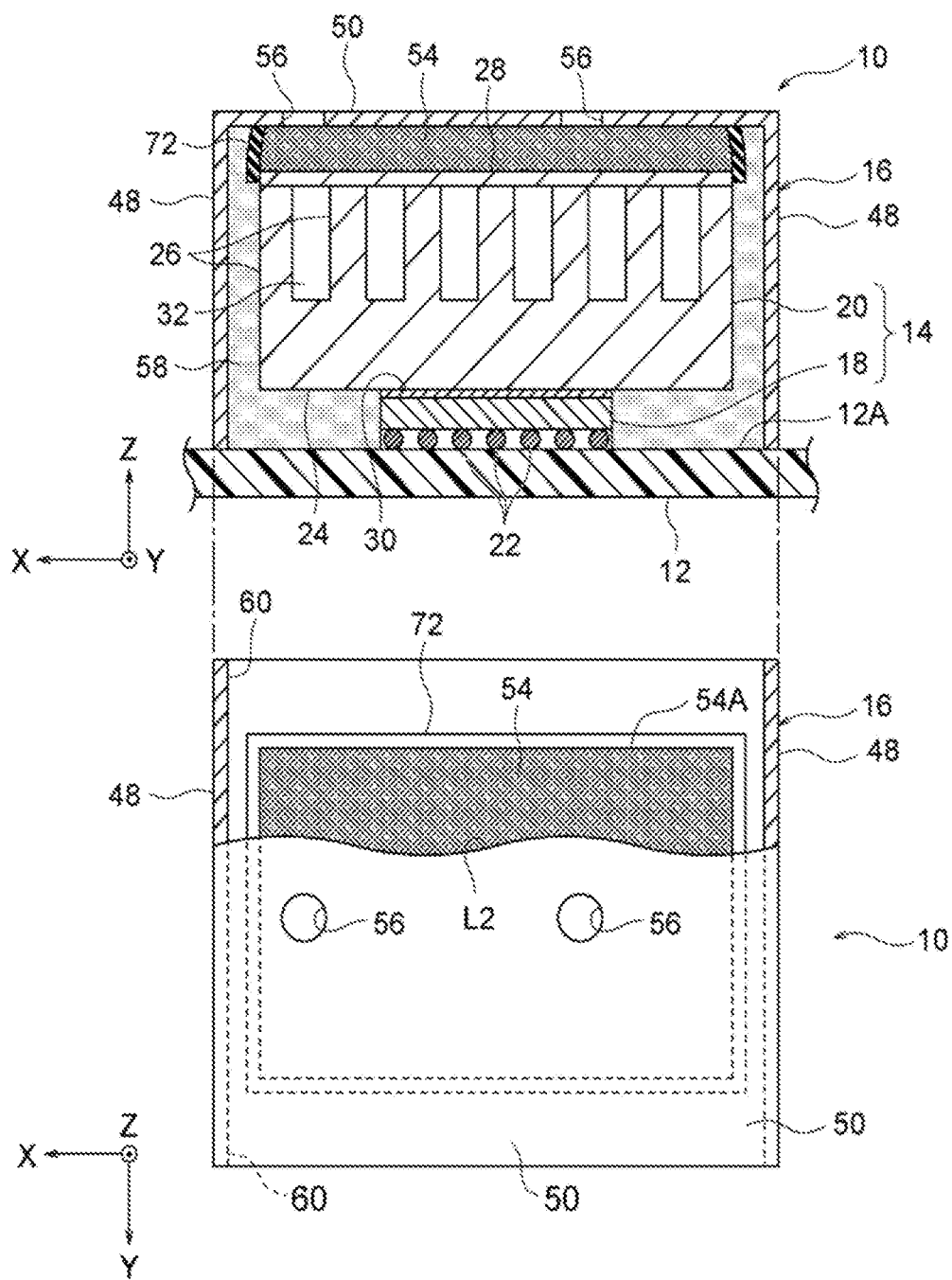
FIG. 5 is a two-sided view of an electronic card according to a second embodiment.

FIG. 5 is a two-sided view (longitudinal sectional view and plan view) illustrating the second embodiment of the electronic card 10. In the plan view illustrated in the lower side of FIG. 5, a portion of the cover 16 is cut out by a notch line L2. In the second embodiment illustrated in FIG. 5, the configuration of the electronic card 10 is changed as follows as compared to the first embodiment illustrated in FIG. 2. That is, in the second embodiment illustrated in FIG. 5, an annular member 72 is used instead of the annular member 52 illustrated in FIG. 2.

The annular member 72 is made of, for example, rubber having elasticity. The annular member 72 is, for example, a ring member mounted in the outer peripheral portion of the first ceiling portion 28. The annular member 72 extends in the facing direction of the first ceiling portion 28 and the second ceiling portion 50, and has an annular shape along the circumferential direction of the first ceiling portion 28. The annular member 72 protrudes toward the second ceiling portion 50 side with respect to the first ceiling portion 28. The end of the annular member 72 on the second ceiling portion 50 side is in contact with the second ceiling portion 50.

The annular member 72 has flexibility by being made of, for example, rubber. Because of the flexibility of the annular member 72, the annular member 72 bends even when the gap between the first ceiling portion 28 and the second ceiling portion 50 is narrower than a prescribed gap due to variations in dimension, and the like. Therefore, the annular member 72 may suppress the heat sink 20 from being pressed toward the electronic component 18 side.

Figure 6:
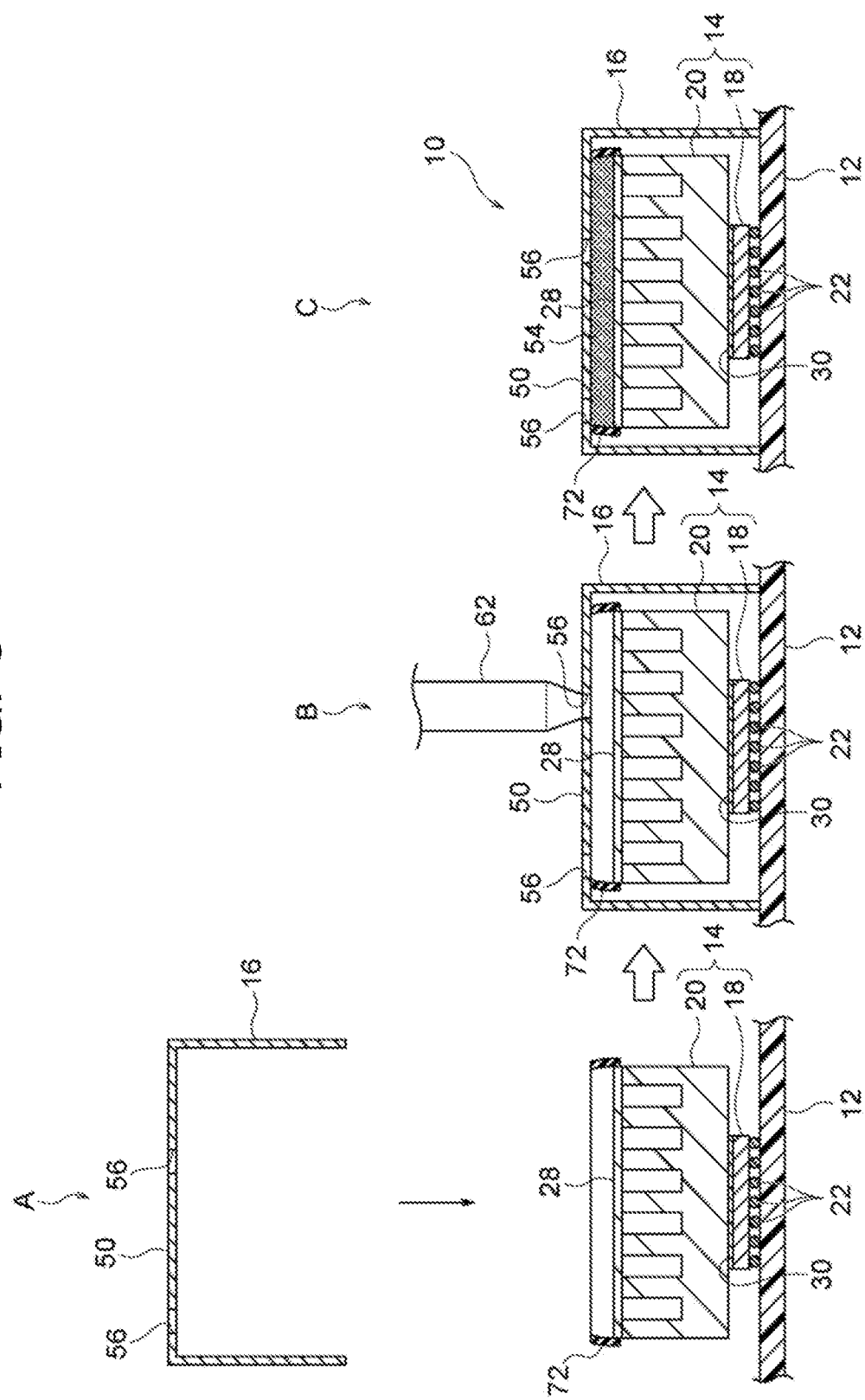
FIG. 6 is a view for explaining a method of manufacturing the electronic card according to the second embodiment.

FIG. 6 is a view for explaining a method of manufacturing the electronic card 10 according to the second embodiment. The method of manufacturing the electronic card 10 according to the second embodiment is the same as the method of manufacturing the electronic card 10 according to the first embodiment described above, except that the annular member 72 is mounted in the first ceiling portion 28.

Even in the electronic card 10 according to the second embodiment, as in the first embodiment, the filling material 54 is filled in the gap between the first ceiling portion 28 and the second ceiling portion 50 inside the annular member 72. Therefore, for example, even when the gap between the first ceiling portion 28 and the second ceiling portion 50 is narrower than the prescribed gap, a variation in the size of this gap may be absorbed, so that the heat sink 20 may be suppressed from being pressed toward the substrate 12 side by the filling material 54. As a result, it is possible to prevent a load from being applied to the solder bumps 22, so that the damage to the solder bumps 22 may be suppressed.

In addition, in the electronic card 10 according to the second embodiment, the annular member 72 that has an annular shape along the circumferential direction of the first ceiling portion 28 is provided in the first ceiling portion 28, and the filling material 54 is filled inside the annular member 72. Therefore, it is possible to prevent the filling material 54 from flowing out of the gap between the first ceiling portion 28 and the second ceiling portion 50, so that the gap between the first ceiling portion 28 and the second ceiling portion 50 may be closed by the filling material 54. Thus, the filling material 54 may prevent the air from flowing into the gap between the first ceiling portion 28 and the second ceiling portion 50, so that the flow rate of the air flowing through the air passage 32 between the fins 26 may be increased. As a result, the cooling efficiency of the heat sink 20 may be improved.

Further, by filling the inside of the annular member 72 with the filling material 54, the shape of the annular member 72 protruding toward the second ceiling portion 50 side with respect to the first ceiling portion 28 may be maintained, so that a deformation of the annular member 72 may be prevented. Thus, for example, as compared with a case where the gap between the first ceiling portion 28 and the second ceiling portion 50 is closed only by the annular member 72 without using the filling material 54, the gap between the first ceiling portion 28 and the second ceiling portion 50 may be closed in a more airtight manner.

Further, the annular member 72 is a ring member having elasticity. Therefore, even when there is a variation in the circumferential length of the first ceiling portion 28, the variation may be absorbed, so that the annular member 72 may be mounted in the outer peripheral portion of the first ceiling portion 28.

In the second embodiment, the annular member 72 is mounted in the outer peripheral portion of the first ceiling portion 28, but, for example, in a case where an annular mounting portion such as a groove or a step is formed on the upper surface of the first ceiling portion 28, the annular member 72 may be mounted in this annular mounting portion.

Third Embodiment

Figure 7:
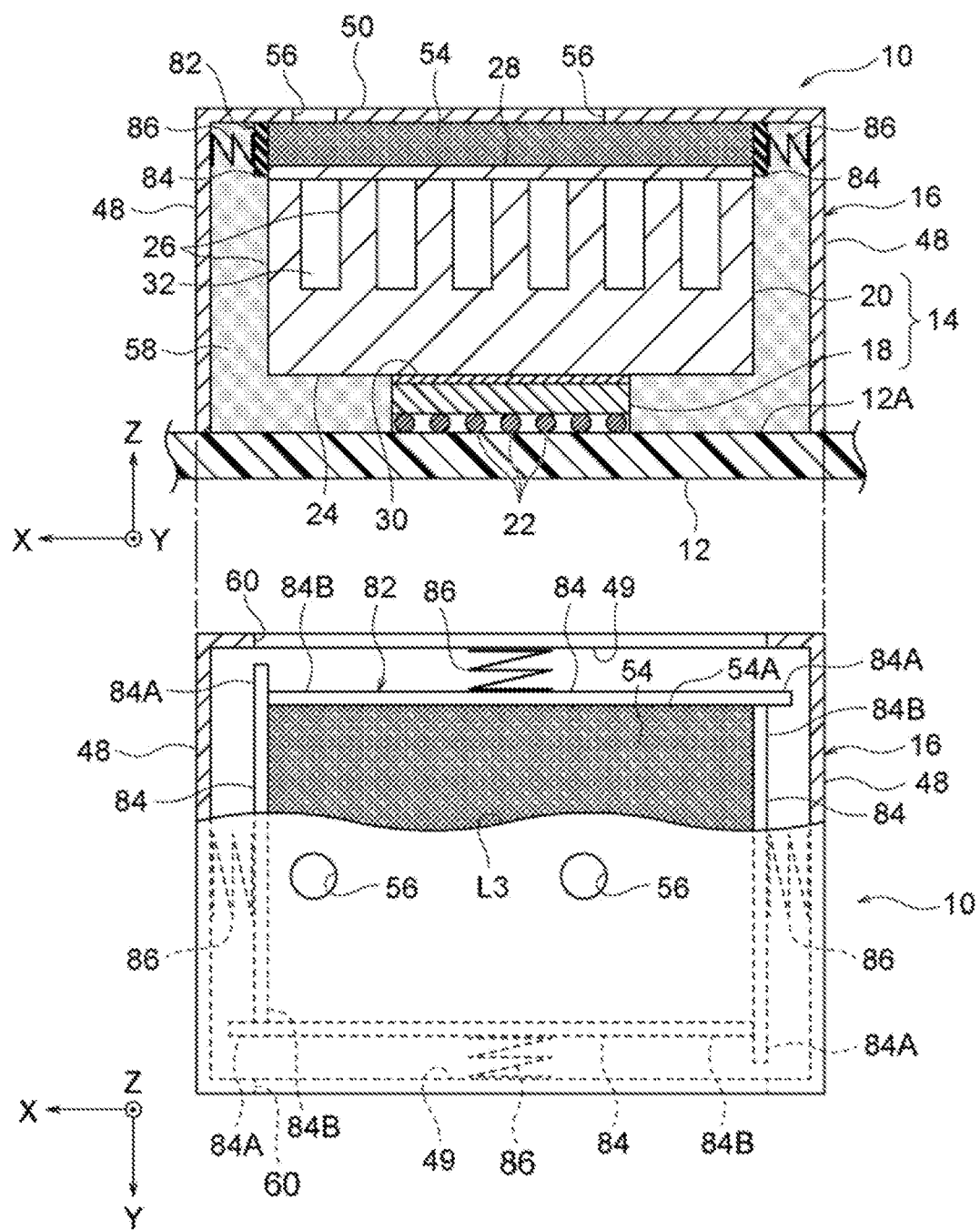
FIG. 7 is a two-sided view of an electronic card according to a third embodiment.

FIG. 7 is a two-sided view (longitudinal sectional view and plan view) illustrating a third embodiment of the electronic card 10. In the plan view illustrated in the lower side of FIG. 7, a portion of the cover 16 is notched by a notch line L3. In the third embodiment illustrated in FIG. 7, the configuration of the electronic card 10 is changed as follows from the first embodiment illustrated in FIG. 2. That is, in the third embodiment illustrated in FIG. 7, an annular member 82 is used instead of the annular member 52 illustrated in FIG. 2.

The annular member 82 is provided in the second ceiling portion 50. The annular member 82 is a frame-shaped body having a plurality of side members 84 independent of each other. As an example, the number of side members 84 is four, and the annular member 82 has a quadrangular shape in a plan view. Each of the side members 84 is, for example, formed in a plate shape.

The annular member 82 extends in the facing direction of the first ceiling portion 28 and the second ceiling portion 50, and has an annular shape along the circumferential direction of the first ceiling portion 28. The annular member 82 protrudes toward the first ceiling portion 28 side with respect to the second ceiling portion 50. The end of the annular member 82 on the first ceiling portion 28 side is mounted in the outer peripheral portion of the first ceiling portion 28.

The cover 16 has a plurality of side wall portions 48 and 49 facing the side members 84. The pair of side wall portions 48 faces with each other in the arrow X direction, and the pair of side wall portions 49 faces with each other in the arrow Y direction. Each of the side wall portions 49 is formed on the second ceiling portion 50 side in the cover 16, and an opening 60 is formed in each of a gap between one side wall portion 49 and the substrate 12 and a gap between the other side wall portion 48 and the substrate 12.

An elastic support member 86 having elasticity and supporting the side members 84 is provided between each side member 84 and the side wall portion 49. The elastic support member 86 is, for example, a coil spring. When a plurality of elastic support members 86 are in a free state, the side members 84 have a size and a shape that may be mounted (fitted) on the outer peripheral portion of the first ceiling portion 28.

One end 84A of each side member 84 in the length direction protrudes outside the annular shape of the annular member 82. The one end 84A of each side member 84 in the length direction slidably supports the other end 84B of the side member 84 adjacent to one side in the length direction. Further, the other end portion 84B of each side member 84 in the length direction is slidably supported by one end portion 84A of the side member 84 adjacent to the other side in the length direction. With such a configuration, the annular member 82 may be expanded and contracted.

Figure 8:
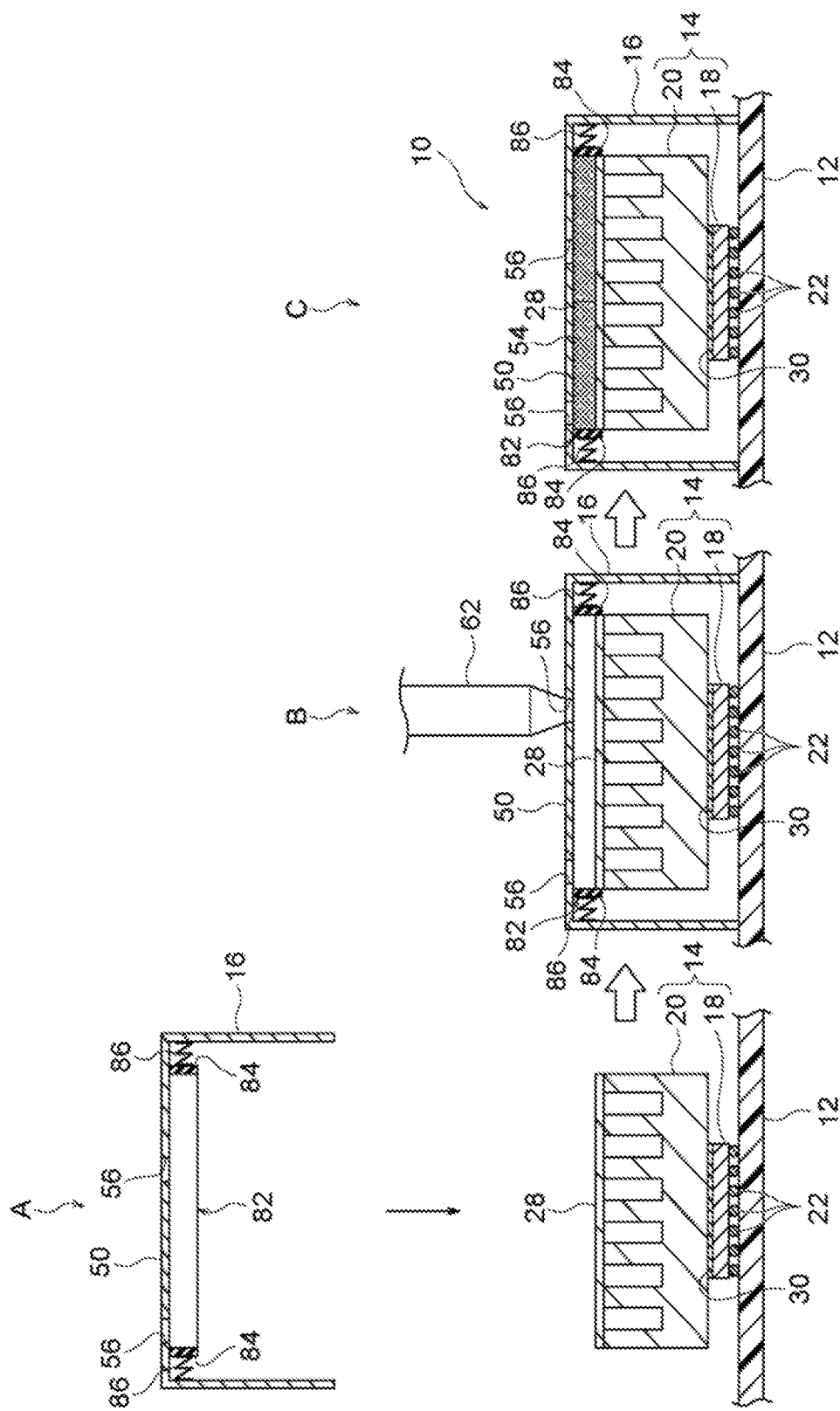
FIG. 8 is a view for explaining a method of manufacturing the electronic card according to the third embodiment.

FIG. 8 is a view for explaining a method of manufacturing the electronic card 10 according to the third embodiment. The method of manufacturing the electronic card 10 according to the third embodiment is the same as the method of manufacturing the electronic card 10 according to the first embodiment described above, except that the annular member 82 is provided in the second ceiling portion 50.

In the method of manufacturing the electronic card 10 according to the third embodiment, as illustrated in step A, when the cover 16 is brought closer to the substrate 12 side, the end portion on the first ceiling portion 28 side in the side members 84 provided in the second ceiling portion 50 contacts the first ceiling portion 28. Then, the side members 84 slide in a direction in which the annular member 82 expands, accompanied by the compression deformation of the elastic support members 86, and the annular member 82 is mounted in the outer peripheral portion of the first ceiling portion 28.

Even in the electronic card 10 according to the third embodiment, as in the first embodiment, the filling material 54 is filled in the gap between the first ceiling portion 28 and the second ceiling portion 50 inside the annular member 82. Therefore, for example, even when the gap between the first ceiling portion 28 and the second ceiling portion 50 is narrower than the prescribed gap, a variation in the size of this gap may be absorbed, so that the heat sink 20 may be suppressed from being pressed toward the substrate 12 side by the filling material 54. As a result, it is possible to prevent a load from being applied to the solder bumps 22, so that the damage to the solder bumps 22 may be suppressed.

Further, in the electronic card 10 according to the third embodiment, the annular member 82 that has an annular shape along the circumferential direction of the first ceiling portion 28 is mounted in the outer peripheral portion of the first ceiling portion 28, and the filling material 54 is filled inside the annular member 82. Therefore, it is possible to prevent the filling material 54 from flowing out of the gap between the first ceiling portion 28 and the second ceiling portion 50, so that the gap between the first ceiling portion 28 and the second ceiling portion 50 may be closed by the filling material 54. Thus, the filling material 54 may prevent the air from flowing into the gap between the first ceiling portion 28 and the second ceiling portion 50, so that the flow rate of the air flowing through the air passage 32 between the fins 26 may be increased. As a result, the cooling efficiency of the heat sink 20 may be improved.

Further, by filling the filling material 54 inside the annular member 82, the gap between the annular member 82 and the first ceiling portion 28 and the gap between the annular member 82 and the second ceiling portion 50 may be closed. Thus, for example, as compared with a case where the gap between the first ceiling portion 28 and the second ceiling portion 50 is closed only by the annular member 82 without using the filling material 54, the gap between the first ceiling portion 28 and the second ceiling portion 50 may be closed in a more airtight manner.

The annular member 82 is a frame-shaped body having the side members 84 elastically supported by the elastic support members 86. Therefore, even when there is a variation in the circumferential length of the first ceiling portion 28, the variation may be absorbed, so that the annular member 82 may be mounted in the outer peripheral portion of the first ceiling portion 28.

In the third embodiment, the annular member 82 provided in the second ceiling portion 50 is mounted in the outer peripheral portion of the first ceiling portion 28. However, for example, when the annular member 82 has flexibility, the annular member 82 may be formed to be smaller than the first ceiling portion 28 so that the annular member 82 may be in contact with the upper surface of the first ceiling portion 28.

Fourth Embodiment

Figure 9:
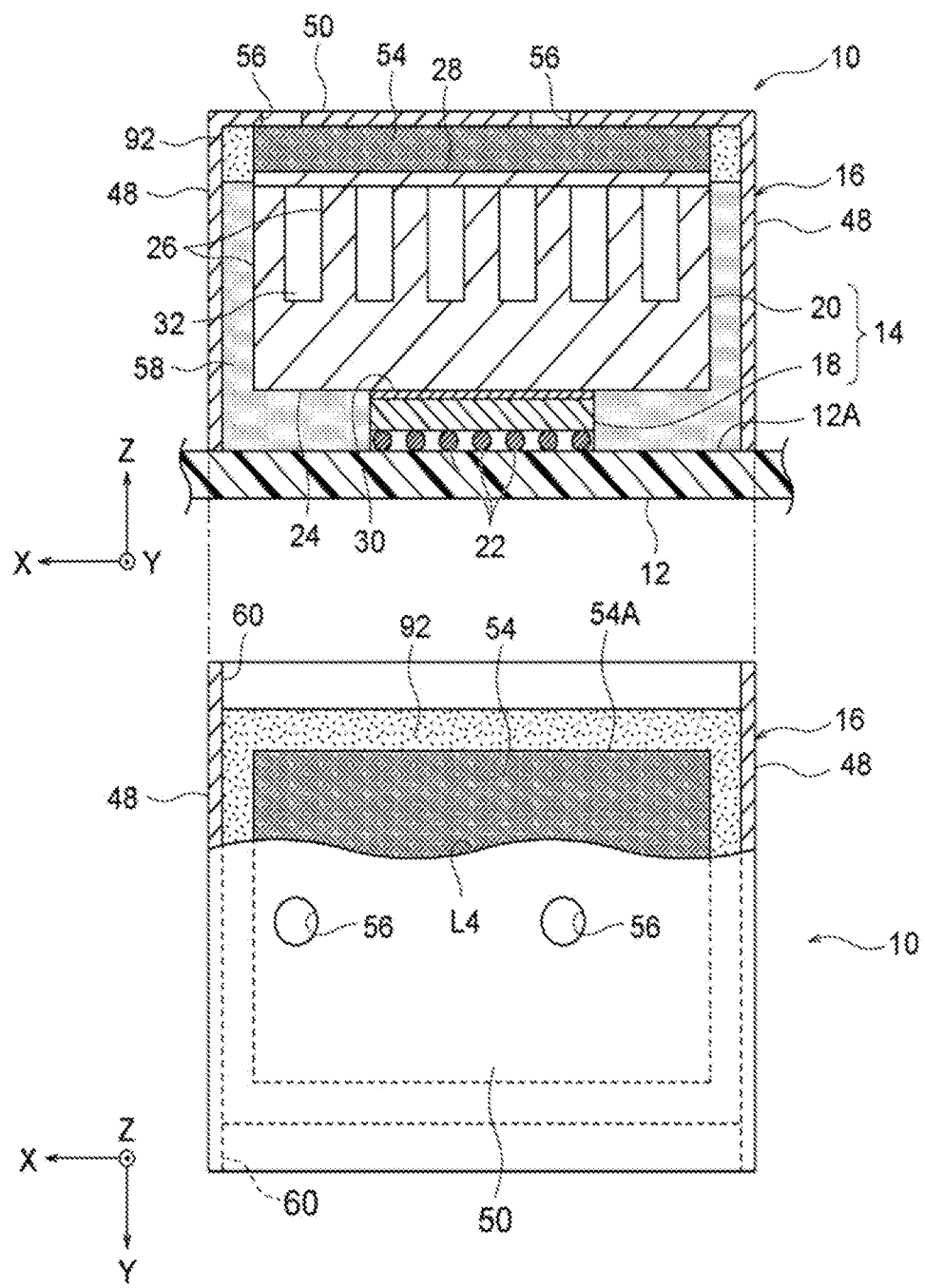
FIG. 9 is a two-sided view of an electronic card according to a fourth embodiment.

FIG. 9 is a two-sided view (longitudinal sectional view and plan view) illustrating a fourth embodiment of the electronic card 10. In the plan view illustrated in the lower side of FIG. 9, a portion of the cover 16 is cut out by a notch line L4. In the fourth embodiment illustrated in FIG. 9, the configuration of the electronic card 10 is changed as follows as compared to the first embodiment illustrated in FIG. 2. That is, in the fourth embodiment illustrated in FIG. 9, an annular member 92 is used instead of the annular member 52 illustrated in FIG. 2.

The annular member 92 is provided in the second ceiling portion 50. The annular member 92 is, for example, a frame-shaped member having a frame shape made of a foam material. The annular member 92 has a quadrangular shape in a plan view.

The annular member 92 extends in the facing direction of the first ceiling portion 28 and the second ceiling portion 50, and has an annular shape along the circumferential direction of the first ceiling portion 28. The annular member 92 protrudes toward the first ceiling portion 28 side with respect to the second ceiling portion 50. The end portion of the annular member 92 in the first ceiling portion 28 side is mounted in the outer peripheral portion of the first ceiling portion 28.

Figure 10:
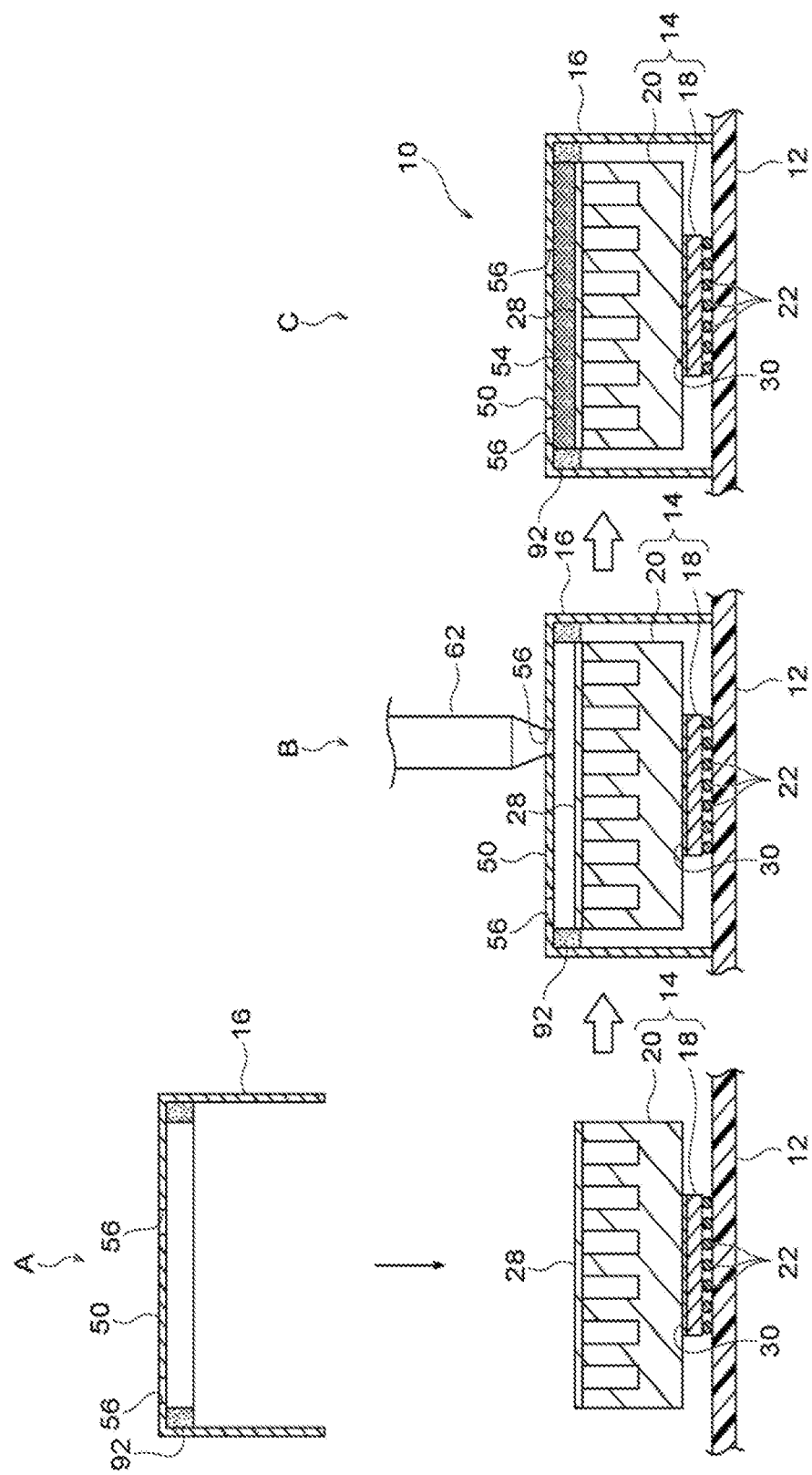
FIG. 10 is a view for explaining a method of manufacturing the electronic card according to the fourth embodiment.

FIG. 10 is a view for explaining a method of manufacturing the electronic card 10 according to the fourth embodiment. The method of manufacturing the electronic card 10 according to the fourth embodiment is the same as the method of manufacturing the electronic card 10 according to the first embodiment described above, except that the annular member 92 is provided in the second ceiling portion 50.

In the method of manufacturing the electronic card 10 according to the fourth embodiment, as illustrated in step A, when the cover 16 is brought closer to the substrate 12 side, the end portion on the first ceiling portion 28 side in the annular members 92 provided in the second ceiling portion 50 contacts the first ceiling portion 28. Then, the annular member 92 is mounted in the outer peripheral portion of the first ceiling portion 28 while being deformed in a direction in which the annular member 92 expands.

Even in the electronic card 10 according to the fourth embodiment, as in the first embodiment, the filling material 54 is filled in the gap between the first ceiling portion 28 and the second ceiling portion 50 inside the annular member 52. Therefore, for example, even when the gap between the first ceiling portion 28 and the second ceiling portion 50 is narrower than the prescribed gap, a variation in the size of this gap may be absorbed, so that the heat sink 20 may be suppressed from being pressed toward the substrate 12 side by the filling material 54. As a result, it is possible to prevent a load from being applied to the solder bumps 22, so that damage to the solder bumps 22 may be suppressed.

Further, in the electronic card 10 according to the fourth embodiment, the annular member 92 that has an annular shape along the circumferential direction of the first ceiling portion 28 is mounted in the outer peripheral portion of the first ceiling portion 28, and the filling material 54 is filled inside the annular member 92. Therefore, it is possible to prevent the filling material 54 from flowing out of the gap between the first ceiling portion 28 and the second ceiling portion 50, so that the gap between the first ceiling portion 28 and the second ceiling portion 50 may be closed by the filling material 54. Thus, the filling material 54 may prevent the air from flowing into the gap between the first ceiling portion 28 and the second ceiling portion 50, so that the flow rate of the air flowing through the air passage 32 between the fins 26 may be increased. As a result, the cooling efficiency of the heat sink 20 may be improved.

In addition, by filling the inside of the annular member 92 with the filling material 54, the gap between the annular member 92 and the first ceiling portion 28 and the gap between the annular member 92 and the second ceiling portion 50 may be closed. Thus, for example, as compared with a case where the gap between the first ceiling portion 28 and the second ceiling portion 50 is closed only by the annular member 92 without using the filling material 54, the gap between the first ceiling portion 28 and the second ceiling portion may be closed in a more airtight manner.

The annular member 92 is a frame-shaped member that has a frame shape made of a foam material. Therefore, even when there is a variation in the circumferential length of the first ceiling portion 28, the variation may be absorbed, so that the annular member 92 may be mounted in the outer peripheral portion of the first ceiling portion 28.

In the fifth embodiment, the annular member 92 provided in the second ceiling portion 50 is mounted in the outer peripheral portion of the first ceiling portion 28. However, for example, the annular member 92 may be formed to be smaller than the first ceiling portion 28 so that the annular member 92 may be in contact with the upper surface of the first ceiling portion 28.

Fifth Embodiment

Figure 11:
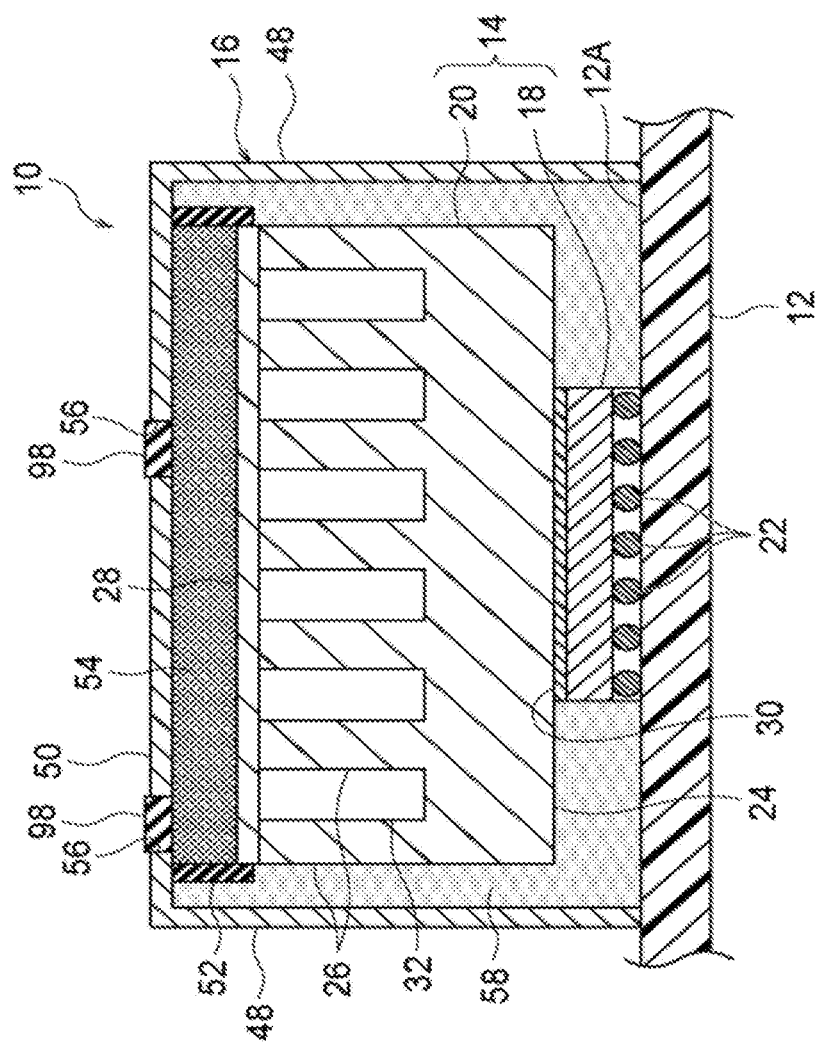
FIG. 11 is a longitudinal sectional view of an electronic card according to a fifth embodiment.

FIG. 11 is a longitudinal sectional view illustrating a fifth embodiment of the electronic card 10. In the fifth embodiment illustrated in FIG. 11, the configuration of the electronic card 10 is changed as follows as compared to the first embodiment illustrated in FIG. 2. That is, in the fifth embodiment illustrated in FIG. 11, a closing member 98 that closes the through-hole 56 is used. The closing member 98 is, for example, a cap or a check valve fitted in the through-hole 56. The check valve has a function of restricting the filling material 54 from overflowing from the through-hole 56 while allowing the filling material 54 to be filled through the through-hole 56. In this way, when the closing member 98 that closes the through-hole 56 is used, the filling material 54 may be prevented from overflowing through the through-hole 56.

Next, a modification of the present embodiment will be described.

In the above embodiment, the electronic card 10 is a PCI card, as an example, but the electronic card 10 may be a card other than the PCI card.

Further, in the above-described embodiment, the plurality of through-holes 56 are formed in the second ceiling portion 50, but, for example, by securing the opening area of the through-holes 56, the number of through-holes 56 for injecting the filling material 54 may be one when the air is capable of being discharged from the through-hole 56.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic card comprising: a substrate; an electronic device bonded to the substrate via a solder bump, and configured to include a first ceiling; and a cover fixed to the substrate, provided over the electronic device, and configured to include a second ceiling that faces the first ceiling, wherein the first ceiling or the second ceiling is provided with an annular member extending in a facing direction of the first ceiling and the second ceiling, the annular member forming an annular shape along a circumferential direction of the first ceiling, wherein the first ceiling and the second ceiling form a gap between the first ceiling and the second ceiling filled with a filling material inside the annular member, wherein the second ceiling includes a through hole at a position that overlaps the filling material when viewed in a plan view of the second ceiling; wherein the electronic device includes an electronic component bonded to the substrate via the solder bump, and a heat sink bonded to the electronic component, wherein the heat sink includes the first ceiling, and wherein the first ceiling is free of direct contact with an upper surface of the electronic component.

2. The electronic card according to claim 1, wherein the cover is duct-shaped.

3. The electronic card according to claim 1, wherein the second ceiling includes a plurality of through-holes.

4. The electronic card according to claim 1, further comprising: a spring configured to press the heat sink toward a side of the electronic component, wherein a first pressing force by which the filling material presses the heat sink toward the side of the electronic component is set to be weaker than a second pressing force by which the spring presses the heat sink toward the side of the electronic component side.

5. The electronic card according to claim 1, wherein the filling material is a thermal bonding material.

6. The electronic card according to claim 5, wherein the filling material is liquid, semi-liquid, or solid.

7. The electronic card according to claim 1, wherein the annular member is provided in the first ceiling portion.

8. The electronic card according to claim 7, wherein the annular member is a tape material that is annularly wound around the first ceiling along the circumferential direction of the first ceiling.

9. The electronic card according to claim 7, wherein the annular member is a ring member that has elasticity and is mounted in an outer peripheral portion of the first ceiling.

10. The electronic card according to claim 7, wherein the annular member has flexibility.

11. The electronic card according to claim 1, wherein the annular member is provided in the second ceiling.

12. The electronic card according to claim 11,
wherein the annular member is a frame-shaped body that has a plurality of side members independent of each other,
wherein the cover has a plurality of side walls each that faces each of the plurality of side members, and
wherein the plurality of side walls and the plurality side members form a gap between a side wall of the plurality of side walls and a side member of the plurality of side members filled with an elastic support member that has elasticity and supports the plurality of side members.

13. The electronic card according to claim 11, wherein the annular member is a frame-shaped member made of a foam material and having a frame shape.

14. The electronic card according to claim 1, further comprising:
a closing member configured to close the through-hole.

15. A method of manufacturing an electronic card, the method comprising: bonding an electronic device to a substrate via a solder bump; providing an annular member that extends in a facing direction of a first ceiling of the electronic device and a second ceiling that faces the first ceiling in a cover that is fixed to the substrate and provided over the electronic device, the annular member being provided with the first ceiling or the second ceiling, and forming an annular shape along a circumferential direction of the first ceiling; filling a filling material in a gap between the first ceiling and the second ceiling inside the annular member through a through-hole formed in the second ceiling; wherein the electronic device includes an electronic component bonded to the substrate via the solder bump, and a heat sink bonded to the electronic component, wherein the heat sink includes the first ceiling, and wherein the first ceiling is free of direct contact with an upper surface of the electronic component.

16. An electronic apparatus comprising: a case configured to include a plurality of slots; and an electronic card to be inserted in a slot of the plurality of slots, and configured to include: a substrate, an electronic device bonded to the substrate via a solder bump, and configured to include a first ceiling, and a cover fixed to the substrate, provided over the electronic device, and configured to include a second ceiling that faces the first ceiling, wherein the first ceiling or the second ceiling is provided with an annular member extending in a facing direction of the first ceiling and the second ceiling, the annular member forming an annular shape along a circumferential direction of the first ceiling, wherein the first ceiling and the second ceiling form a gap between the first ceiling and the second ceiling filled with a filling material inside the annular member, wherein the second ceiling includes a through hole at a position that overlaps the filling material when viewed in a plan view of the second ceiling; wherein the electronic device includes an electronic component bonded to the substrate via the solder bump, and a heat sink bonded to the electronic component, wherein the heat sink includes the first ceiling, and wherein the first ceiling is free of direct contact with an upper surface of the electronic component.

* * * * *